Jan. 26, 1971 W. E. ENGELER 3,558,375

VARIABLE CAPACITY DIODE FABRICATION METHOD WITH SELECTIVE DIFFUSION OF JUNCTION REGION IMPURITIES

Filed Sept. 18, 1968

INVENTOR:
WILLIAM E. ENGELER,
by Marvin Snyder
HIS ATTORNEY

United States Patent Office 3,558,375

Patented Jan. 26, 1971

3,558,375
VARIABLE CAPACITY DIODE FABRICATION METHOD WITH SELECTIVE DIFFUSION OF JUNCTION REGION IMPURITIES

William E. Engeler, Scotia, N.Y., assignor to General Electric Company, a corporation of New York Filed Sept. 18, 1968, Ser. No. 760,613
Int. Cl. H01l 7/44
U.S. Cl. 148—175 16 Claims

ABSTRACT OF THE DISCLOSURE

A variable capacity diode with a hyperabrupt P-N junction is fabricated by cutting a hole thorugh an oxide coating atop a P-type semiconductor layer epitaxially grown on a more heavily doped P-type semiconductor substrate, into the epitaxially grown layer. A strongly N-type region containing both donor impurities and faster diffusing acceptor impurities is then grown epitaxially in the hole from the semiconductor at the bottom of the hole. The substrate is then heated to cause the more rapidly diffusing acceptor impurities to diffuse into the epitaxially grown layer ahead of the more slowly diffusing donor impurities and form a narrow region of P+ conductivity, resulting in the desired N+P+PP+ structure.

INTRODUCTION

This invention relates to fabrication of variable capacity diodes, and more particularly to a method of fabricating a variable capacity junction diode having a hyperabrupt junction wherein a portion of the junction region is formed by selective diffusion of impurities therein.

A variable capacity diode may be described, generally, as a semiconductor P-N junction wherein reverse voltage applied thereto appears substantially across a region depleted of mobile charge carriers. As amplitude of reverse voltage changes, the width of this depletion region also changes in direct relation thereto. Since the depletion region acts as an insulator, the diode displays a capacitance which varies in an inverse manner with amplitude of applied voltage.

The degree of dependence of P-N junction capacitance upon amplitude of applied voltage depends on distribution of impurities in the junction region; that is, by lightly doping one side of the junction, the dependency of depletion width on applied voltage increases. Accordingly, if all other factors were equal, the diode having the lowest impurity concentration in the depletion region would exhibit the capacitance of highest voltage sensitivity. However, the sensitivity of capacitance to voltage also depends upon initial capacitance of the device at zero applied voltage. If the depletion width at zero applied voltage is made as small as possible, maximum change in capacitance occurs when a voltage is applied; that is, the ratio of capacitance at low voltage to capacitance at high voltage is maximized. At zero applied voltage, the depletion width due to the inherent electric field at the junction also varies in an inverse manner with impurity concentration. A high concentration of impurities in the depletion region extant at zero applied voltage is therefore desirable in order to achieve a minimum depletion width at this voltage. Both a large degree of dependency of depletion width on applied voltage, and a minimum depletion width at zero applied voltage, may be achieved by employing a P-N junction having a sharp gradation of impurity distribution. Those junctions having a sharp gradation of impurities within the junction region are termed hyperabrupt.

In W. E. Engeler et al. application Ser. No. 750,526 filed Sept. 18, 1968, filed concurrently herewith and assigned to the instant assignee, a method of fabricating a transistor wherein the base region is formed by selectively diffusing impurities from solid semiconductor material containing a plurality of impurities having different diffusion rates is described and claimed. According to the present invention a variable capacity diode, including a highly doped contact region, is fabricated by selectively diffusing impurities into the junction region from solid semiconductor material containing a plurality of impurities having different diffusion rates. Since the ultimate source of dopant for the epitaxially deposited portions of the device is the bulk semiconductor used as the source in the epitaxial deposition step, better control can be maintained over impurity concentrations in the device than possible with conventional vapor source diffusion processes wherein impurities for each region of the device are deposited separately. This precise control over the impurity concentrations, coupled with close control of the heating required for diffusion, results in the sharp gradation of impurities which are characteristic of hyperabrupt junction regions. Additionally, the invention employs a passivating oxide coating on the semiconductor in order to pattern the doped semiconductor acting as a solid diffusion source, rather than to act as a mask against diffusion. The passivating coating comprises an insulating material in intimate contact with the semiconductor surface and prevents formation of surface states at the semiconductor surface which would otherwise result in electrical leakage and band edge degradation, as well as preventing degradation of the semiconductor surface by chemical action. This is especially advantageous since the silicon dioxide provides a passivation defined area through which the solid diffusion source is grown, without requiring any additional passivation in the practice of the instant invention. This facilitates production of a plurality of variable capacity diodes on a single semiconductor wafer.

Accordingly, one object of the invention is to provide a method of mass producing variable capacity diodes on a semiconductor wafer, with precise control over impurities in the junction regions.

Another object is to provide a method of fabricating a semiconductor diode having a hyperabrupt P-N junction, which method is compatible with processes for fabricating integrated circuits.

Another object is to provide a method of fabricating a variable capacity diode by growing a diffusion source through a passivation defined area of a semiconductor without need for any additional passivation steps.

Briefly, in accordance with a preferred embodiment of the invention, a method of fabricating a variable capacity diode comprises the steps of forming a semiconductor layer of one type conductivity atop a semiconductor substrate of the same type conductivity but more heavily doped. A passivation layer is next formed on the surface of the semiconductor layer. A hole is then etched in the passivation layer and semiconductor material heavily doped with impurities of the opposite conductivity determining type but also containing impurities of the one conductivity determining type is then epitaxially grown in the hole from the semiconductor layer at the bottom of the hole. The impurities of the one conductivity determining type are faster diffusing than the impurities of the opposite conductivity determining type so that by heating the semiconductor material, a predetermined amount of diffusion of impurities of the one conductivity determining type occurs from the epitaxially deposited semiconductor material into the layer of one type conductivity material.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
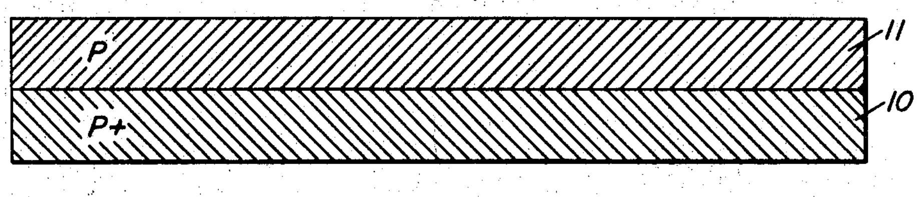
FIGS. 1–5 illustrate various steps performed in practicing the invention.

In FIG. 1, a wafer 10 of semiconductor material such as silicon is illustrated having a layer 11 of the semiconductor material epitaxially grown thereon in conventional fashion. Substrate 10 is heavily doped with impurities of one conductivity determining type, and epitaxial layer 11 is doped with similar conductivity determining impurities but at a lower concentraton. For illustrative purposes, it will be assumed that wafer 10 and layer 11 are doped with acceptor impurities such as boron, aluminum, gallium or indium, and therefore are illustrated as being of $P^+$ and P conductivity respectively. Typical doping levels range from $10^{17}$ to $5\times10^{20}$ atoms per cubic centimeter for wafer 10 and $5\times10^{14}$ to $10^{16}$ atoms per cubic centimeter for layer 11, with wafer 10 being made as conductive as possible consistent with good epitaxial crystal growth in order to present a minimal circuit impedance.

Thickness of layer 11 is determined by the doping level in the depletion region of the device. Layer 11 must be thick enough so that when maximum voltage is applied to the device the depletion region remains wholly within layer 11. If the depletion region were to extend beyond the thickness of layer 11 into wafer 10, performance of the device would be degraded since no further variation in capacitance would be obtained. If region 11 were much larger than the maximum depletion region thickness than a series resistance due to the resistivity of region 11 would be added to the capacitance of the device without any further benefit. Thus, layer 11 ranges in thickness between 3 and 25 microns, being thicker for a lightly doped depletion region than for a heavily doped depletion region.

Figure 2:
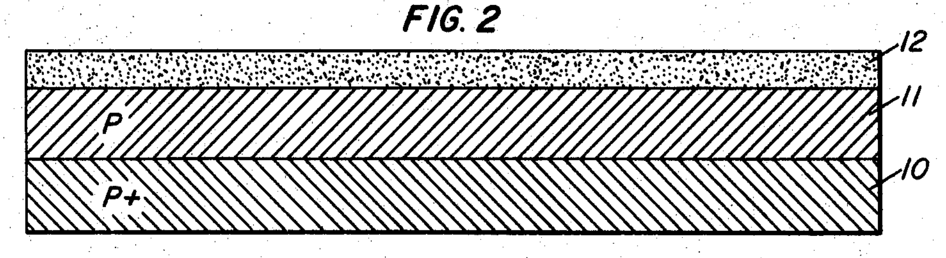

A silicon oxide passivation layer 12, illustrated in FIG. 2, is next grown on layer 11, in conventional fashion, to a thickness typically in the range of 1,000 or 2,000 angstroms up to about 1 micron. In the alternative, oxide layer 12 may be deposited thereon. As still another alternative, layer 12 may comprise a solidified amorphous glass including silicon, oxygen and nitrogen deposited in the manner described and claimed in F. K. Heumann application Ser. No. 598,305, filed Dec. 1, 1966, now abandoned and assigned to the instant assignee. Layer 12, as yet a further alternative, may comprise a layer of silicon nitride overlying a layer of silicon oxide in the manner described and claimed in F. H. Horn application Ser. No. 530,811, filed Mar. 1, 1966 and assigned to the instant assignee. The purpose of the silicon nitride layer is to form a barrier against ion drift to the silicon surface through the insulating layer.

Figure 3:
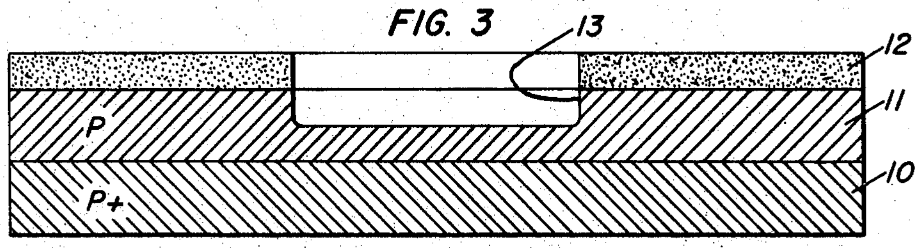

An opening 13 is then cut in oxide layer 12 by employment of conventional photolithographic techniques utilizing photoresist compounds, and a vapor etch, conveniently chlorine or HCl gas, is employed in a gas-tight system through aperture 13 in oxide layer 12 so as to extend hole 13 down into epitaxial layer 11, as illustrated in FIG. 3. In the event layer 12 comprises an oxynitride coating, as described in the aforementioned Heumann application, or a nitride coating atop an oxide coating, as described in the aforementioned Horn application, aperture 13 is cut using a hydrofluoric acid etch, for example, in the manner described in each of these applications respectively. Hole 13 must not be etched beyond the extent of epitaxial layer 11. Accordingly, the depth of hole 13 is of the order of a few microns. The diameter of hole 13 is typically between 250 and 500 microns, for capacitances in the order of 100 picofarads, and may be made larger or smaller to obtain a larger or smaller capacitance, respectively. In general, capacitance of the device varies linearly with its area.

Figure 4:
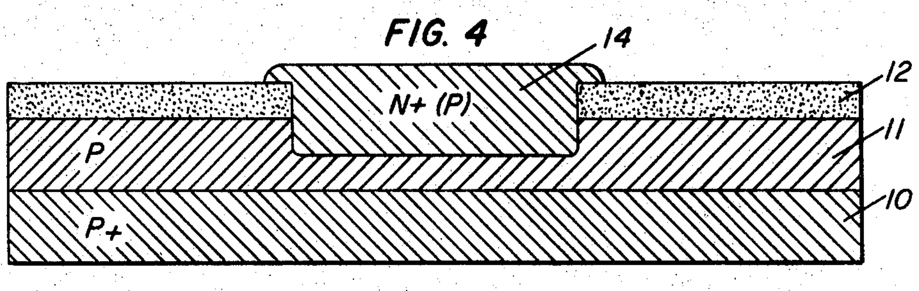

Thereafter, conveniently keeping the device in the same system in which the vapor etch of silicon oxide layer 12 was performed and pumping out any residual chlorine or HCl gas, hole 13 is filled with material 14, such as illustrated in FIG. 4, grown epitaxially from layer 11. The epitaxially grown material is heavily doped with impurities of conductivity determining type opposite to those in layers 10 and 11, and hence is indicated as being of $N^+$ conductivity. However, epitaxially grown material 14 is compensated since it contains compensating impurities, here P-type as indicated by (P) in FIG. 4. During the epitaxial growth of material 14, the device is maintained at the lowest temperature possible, consistent with good crystal growth; for impurities in material 14 which are P-type determining, such as boron or gallium, or N-type determining, such as arsenic or antimony, a temperature in the order of 900° C., maintained for several minutes, causes only diffusion of these impurities from material 14.

Material 14 is epitaxially grown to an extent which permits the material to protrude above the level of, and overlap onto, oxide layer 12. Examples of processes by which region 14 may be grown epitaxially are described and claimed in W. C. Dash et al. Pat. No. 3,316,130, issued Apr. 25, 1967 and assigned to the instant assignee. As described in the aforementioned Dash patent, for example, this epitaxial deposition is performed by providing a source of silicon juxtaposed in closely spaced relation with hole 13, which is illustrated in FIG. 3, heating the source and the device, with the device being heated to a higher temperature than the source, and introducing an atmosphere of iodine vapor into the system so as to cause silicon from the source to be epitaxially grown on the semiconductor material of the device through hole 13. In this process, the iodine vapor pressure is typically 2 millimeters of mercury and the source temperature is typically 1,000° C., while the source contains both N-type and P-type impurities in a concentration to ensure that epitaxially grown region 14 contains the desired concentrations of impurities. Such concentrations in region 14 are in the range of $10^{17}$ to $5\times10^{20}$ atoms per cubic centimeter of donor impurities and several times less for acceptor impurity concentration. Typical impurity concentrations in region 14 might be, for example, about $3\times10^{18}$ atoms per cubic centimeter of donor impurities and $1.5\times10^{18}$ atoms per cubic centimeter of acceptor impurities.

Silicon material 14 may, in the alternative, be deposited epitaxially by hydrogen reduction of $SiCl_4$ at a temperature of 950° C. Growth rates in the order of one micron per minute may be achieved in this manner. Doping of material 14 may be accomplished, as is well known, by incorporating into the transport gas stream vapors such as $PH_3$, $AsCl_3$, $B_2H_6$ or $SbCl_5$, for example, together with the $SiCl_4$.

Figure 5:
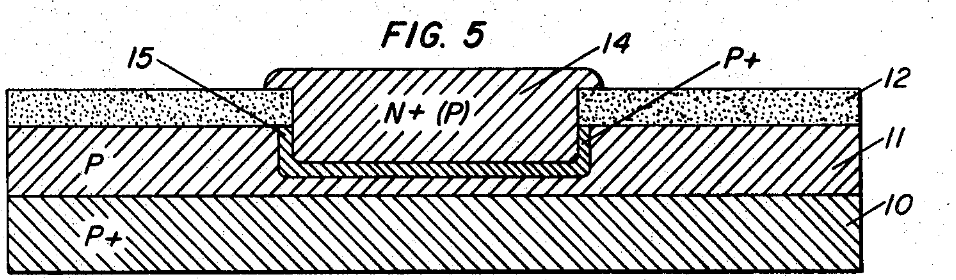

In the structure illustrated in FIG. 4, epitaxially grown region 14 contains acceptor impurities of a type which diffuse faster than the donor impurities. For example, the acceptor impurities may comprise gallium or boron while the donor impurities may comprise antimony or arsenic. The entire structure is then heated to a temperature of about 1,000° C., for sufficient time such that the more rapidly diffusing impurities, the acceptor impurities in this case, form a very narrow region 15, shown in FIG. 5, which is in the order of a fraction of a micron in thickness. This heating step may be carried out as a separate step or, in the alternative, may be performed by continued heating following the start of epitaxial deposition of region 14.

Region 15 is fabricated to be as narrow as possible in order to establish an initial capacitance, or capacitance at zero applied voltage, which is as high as possible. The minimum limitation on thickness of region 15 is imposed when the junction is made so abrupt that tunneling takes place. This occurs when the thickness of region 15 approaches two or three hundred angstroms. The maximum limitation on thickness of region 15 is imposed by the thickness of layer 11 since sufficient distance between region 15 and the interface between layers 11 and 10 must be provided in order to permit expansion of the depletion region thickness and concomitant change in capacitance; for example, an increase in depletion region thickness from 1 micron to 20 microns would produce a 20 to 1 variation in capacitance.

In order to deplete a region of the desired thickness at zero applied voltage, a predetermined concentration of compensating impurities must be present in region 14. This concentration varies inversely as the square of the junction width, and is of the order of $10^{18}$ atoms per cubic centimeter for a 1,000 angstroms depletion region. Higher concentrations require a bias voltage to be applied in order to fully deplete region 15.

In comparison to the concentration of acceptor impurities in layer 11, the average concentration of acceptor impurities in region 15 (which ranges from the concentration of acceptor impurities in region 11, at the interface of regions 11 and 15, and approaches the concentration of acceptor impurities in region 14, at the interface of regions 14 and 15) is sufficiently high to designate the region as being of $P^+$ conductivity. The resulting structure, therefore, is seen to be of $N^+P^+PP^+$ conductivity and, due to extremely thin yet heavily doped region 15 in contact with lightly doped region 11, contains the sharp gradation of impurity distribution required to obtain a large degree of dependency of depletion width on applied voltage, while at the same time maintaining a high capacity at zero applied voltage. Accordingly, the resulting structure comprises a diode possessing a capacity which changes rapidly with applied voltage. Electrical contacts may be made to $N^+$ region 14 and $P^+$ substrate 10 in conventional manner. Application of a reverse voltage across the P-N junction between regions 14 and 15 thus controls thickness of the depletion region and, by varying amplitude of this reverse voltage, the capacity exhibited by the diode may be controllably varied.

In the alternative, a variable capacity diode of $P^+N^+NN^+$ structure may be fabricated in a manner similar to that previously described, but with wafer 10 and layer 11 being doped to $N^+$ and N conductivity respectively with donor impurities such as phosphorous, arsenic or antimony, and with epitaxially grown material 14 being heavily doped to $P^+$ conductivity but containing compensating N-type impurities. In such event, epitaxially grown material 14 contains donor impurities of a type which diffuse faster than the acceptor impurities; for example, the donor impurity may comprise phosphorous while the acceptor impurity may comprise gallium or boron. The resulting diode also contains a hyperabrupt P-N junction therein.

The foregoing describes a method of mass producing variable capacity diodes on a semiconductor wafer, with precise control over impurities in the junction regions. The diode is fabricated with a hyperabrupt P-N junction so as to exhibit a wide variation in capacity with variation in applied reverse voltage. The diode fabrication process, which is compatible with integrated circuit fabrication processes, includes growing a diffusion source through a passivation defined area of a semiconductor without need for any additional passivation steps.

The following examples are set forth to further explicate practice of this invention. These examples include specific values of the parameters involved so that the invention may be practiced by those skilled in the art. However, these examples are provided for purposes of illustration only, and are not to be construed in a limiting sense.

EXAMPLE 1

A silicon wafer containing a concentration of $10^{18}$ boron atoms/cc. to produce an electrical resistivity of about 0.05 ohm-cm. is provided. The wafer is momentarily etched in HCl gas. A 7 micron thick layer is next epitaxially grown on the <111> surface of the wafer by conventional hydrogen reduction of $SiCl_4$ in an atmosphere containing a slight (in the order of parts per ten billion) boron concentration in the form of $B_2H_6$ so that a uniformly doped layer of single crystal silicon containing $3\times10^{15}$ boron atoms per cc. is formed. This process takes place at 1,100° C. A dry thermal oxide of 2,700 A. thickness is next grown onto the wafer by heating the wafer in an atmosphere of dry oxygen for 10 hours at a temperature of 1,000° C. This is followed by an anneal at 1,000° C. in an atmosphere of dry helium for a period of 2 hours. A 1,000 A. layer of silicon oxynitride is next deposited on the wafer by pyrolysis of a mixture of $SiH_4$, $NH_3$, and NO as described in detail in F. K. Heumann application Ser. No. 598,305 filed Dec. 1, 1966. A layer of molybdenum is next conventionally triode sputtered onto the oxynitride layer atop the wafer, which is maintained at a temperature of 500° C. to a thickness of 2,000 A. The wafer is then cooled to room temperature and the molybdenum layer is coated with a layer of photoresist material such as KMER, available from Eastman Kodak Company, Rochester, N.Y. The desired pattern defining the extent of the capacitors is produced by exposing the photoresist film to ultraviolet light. The pattern is in the form of a plurality of squares, each 14 mils on a side, repeated every 20 mils. The unpolymerized photoresist material is next developed away in accordance with procedures furnished by the photo resist manufacturer and the film is baked for one hour at 200° C. The molybdenum film is then etched for ½ minute in a molybdenum etchant comprising 76% orthophosphoric acid, 6% glacial acetic acid, 3% nitric acid and 15% water. The wafer is next immersed in a bath of hot (180° C.) phosphoric acid for 15 minutes to transfer the etched pattern to the silicon oxynitride layer. The molybdenum is thereafter removed with the molybdenum etchant and the pattern is transferred to the underlying silicon layer by etching for 4 minutes in buffered hydrofluoric acid comprising 10 parts 40% $NH_4F$ and one part 48% HF. The silicon is thus exposed in the plurality of squares pattern. The wafer is then placed in a reaction chamber and momentarily brought to a temperature of 1,200° C. in a vacuum in order to remove any residual oxide on the silicon surface which is to experience epitaxial growth. The wafer is then heated to 700° C., and is etched lightly with chlorine gas to remove 2 microns of silicon unprotected by the oxynitride layer. By closely spaced iodine transport of silicon as described in W. C. Dash et al. Pat. No. 3,316,130 issued Apr. 25, 1967, an epitaxial layer 25 microns in thickness is grown in the 2 micron holes etched in the silicon, from the silicon at the bottom of the holes. The epitaxial layer is doped to a concentration of approximately $1.5\times10^{18}$ gallium atoms/cc. and $3\times10^{18}$ arsenic atoms/cc. The wafer is maintained at 1,050° C. for 3 minutes in close proximity (1 mm. separation) to a silicon source wafer maintained at 1,000° C., at an iodine pressure of approximately 2 mm. Hg. These parameters are sufficient to diffuse a heavily doped P-type conductivity region into the 7 micron thick layer epitaxially grown on the surface of the wafer, to a depth of approximately 1,000 A. This results in a capacitance of approximately 130 picofarads at a bias of 0 volts. Any additional fine adjustments in this capacitance value, if necessary, may be made by a subsequent diffusion. The wafer is thereafter cut into separate capacitors which may be mounted on headers, and contacts are applied thereto in conventional fashion. The resulting device exhibits a capacitance of about 7 picofarads when 10 volts reverse bias is applied to the junction, and this capacitance varies approximately as the inverse square root of the applied voltage.

EXAMPLE 2

This process is the same as that described in Example 1 except that a 1,000 A. silicon nitride layer is deposited following the anneal step, instead of the silicon oxynitride layer, and the second epitaxially grown layer is deposited in a reaction vessel by hydrogen reduction of $SiCl_4$ in the presence of $B_2H_6$ and $AsCl_3$ at a temperature of 1,000° C. for 45 minutes, so as to grow 4.5 microns of silicon containing $5\times10^{17}$ boron atoms/cc. and $3\times10^{18}$ arsenic atoms/cc. A diffused region of approximately 1,600 A. in thickness is produced. After the diffusion of the 1,600 A. thick P-type region, a second layer of silicon nitride is deposited over the device at 850° C. in an atmosphere of $SiH_4$ and ammonia. This second silicon nitride layer is patterned in the same manner as the first silicon nitride layer, which, in turn, is patterned in the manner described for the oxynitride layer of Example 1. Silicon which may have been deposited over the initial, lower silicon nitride layer is then removed by employing an etchant comprising 160 cc. acetic acid, 0.5 gm. iodine, 280 cc. nitric acid and 50 cc. 48% HF. The upper and lower silicon nitride layers thus limit etching of the device to the unwanted silicon which overlaps the lower silicon nitride layer. Any remaining silicon nitride atop the second epitaxially grown layer of silicon is then etched away in hot (180° C.) phosphoric acid, and any subsequent diffusion of the 1,000 A. P-type layer which may be required in order to accomplish fine adjustment of the capacitance of the device is then performed. The wafer is then cut into separate capacitors, mounted on headers, and contacts applied, as in Example 1. The final device has characteristics similar to those of the device produced according to Example 1, except that initial capacitance at zero applied voltage is somewhat smaller being in the order of 100 picofarads.

EXAMPLE 3

This process is the same as that described in Example 1 except that the silicon wafer is originally doped to a concentration of $1\times10^{18}$ antimony atoms/cc., so that it is N-type. The first epitaxial layer is then grown on the wafer to a thickness of 7 microns at an impurity concentration of $3\times10^{15}$ antimony atoms/cc. by conventional hydrogen reduction of $SiCl_4$ in an atmosphere containing a slight (in the order of parts per billion) antimony concentration in the form of $SbCl_3$. By closely spaced iodine transport epitaxial growth, as described in the aforementioned Dash et al. patent, deposition for 1 minute results in an epitaxial layer, 4 microns in thickness, grown from the silicon at the bottom of the 2 micron holes etched in the silicon wafer. This 4 micron thick layer contains $3\times10^{18}$ boron atoms/cc., and $5\times10^{17}$ phosphorus atoms/cc. The diffusion of N-type impurities is then performed to a depth of approximately 1,500A. Characteristics of the resulting device are similar to those of the device produced according to Example 2, except that the voltage is applied to the device with opposite polarity. At zero applied voltage, capacitance of the device is in the order of 100 picofarads.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A method of fabricating a variable capacity diode comprising the steps of:

forming a semiconductor layer of one type conductivity atop a semiconductor substrate of the same type conductivity, said layer being less heavily doped than said substrate;

forming a passivation coating on the surface of said semiconductor layer;

etching a hole through said passivation coating;

epitaxially growing from said semiconductor layer in the hole through said passivation coating semiconductor material heavily doped with impurities of the opposite conductivity determining type but also containing impurities of the one conductivity determining type, said impurities of the one conductivity determining type being faster diffusing than said impurities of the oppositee conductivity determining type; and heating said semiconductor material so as to cause a predetermined amount of diffusion of said impurities of the one conductivity determining type from said epitaxially grown semiconductor material into said semiconductor layer and thereby form a hyperabrupt junction.

2. The method of claim 1 wherein said step of forming a semiconductor layer of one type conductivity atop a semiconductor substrate of the same type conductivity comprises epitaxially depositing said semiconductor layer of one type conductivity atop said semiconductor substrate of the same type conductivity.

3. The method of claim 1 wherein said semiconductor material comprises silicon, said impurities of the one conductivity determining type comprises one of the group consisting of gallium and boron, and said impurities of the opposite conductivity determining type comprise one of the group consisting of antimony and arsenic.

4. The method of claim 1 wherein said semiconductor material comprises silicon, said impurities of the one conductivity determining type comprise phosphorous, and said impurities of the opposite conductivity determining type comprise one of the group consisting of gallium and boron.

5. The method of claim 1 including the step of etching a hole in said semiconductor layer to coincide with the hole etched through said passivation coating prior to the step of epitaxially growing said semiconductor material.

6. The method of claim 2 wherein said semiconductor material comprises silicon, said impurities of the one conductivity determining type comprise one of the group consisting of gallium and boron, and said impurities of the opposite conductivity determining type comprise one of the group consisting of antimony and arsenic.

7. The method of claim 2 wherein said semiconductor material comprises silicon, said impurities of the one conductivity determining type comprise phosphorous, and said impurities of the opposite conductivity determining type comprise one of the group consisting of gallium and boron.

8. The method of claim 2 including the step of etching a hole in said semiconductor layer to coincide with the hole etched through said passivation coating prior to the step of epitaxially growing said semiconductor material.

9. The method of claim 8 wherein said semiconductor material comprises silicon, said impurities of the one conductivity determining type comprise one of the group consisting of gallium and boron, and said impurities of the opposite conductivity determining type comprise one of the group consisting of antimony and arsenic.

10. The method of claim 8 wherein said semiconductor material comprises silicon, said impurities of the one conductivity determining type comprise phosphorous, and said impurities of the opposite conductivity determining type comprise one of the group consisting of gallium and boron.

11. The method of claim 1 wherein said step of heating said semiconductor materials is performed concurrently with the step of epitaxially growing said semiconductor material.

12. The method of claim 1 wherein said step of heating said semiconductor material is performed subsequently to the step of epitaxially growing said semiconductor material.

13. The method of claim 1 wherein said step of heating said semiconductor material is performed concurrently with the step of epitaxially growing said semiconductor material and is performed again subsequent to the step of epitaxially growing said semiconductor material.

14. The method of claim 1 wherein said semiconductor comprises silicon and said step of epitaxially growing said semiconductor material comprises maintaining said semiconductor layer at an elevated temperature below 1,100° C. and applying an atmosphere of silicon transported by iodine vapor to said semiconductor layer through the hole etched in said passivation coating .

15. The method of claim 5 wherein semiconductor material comprises silicon and said passivation coating comprises a layer of silicon nitride.

16. The method of claim 5 wherein said semiconductor material comprises silicon and said passivation coating comprises a layer of silicon oxynitride.

References Cited

UNITED STATES PATENTS

| | | | |
|---|---|---|---|
| 3,243,323 | 3/1966 | Corrigan et al. | 148—175 |
| 3,455,020 | 7/1969 | Dawson et al. | 148—187 |
| 3,510,368 | 5/1970 | Hahn | 148—175 |

ALLEN B. CURTIS, Primary Examiner

U.S. Cl. X.R.

148—187; 317—235